(12) United States Patent
Salinas et al.

(10) Patent No.: US 10,566,205 B2
(45) Date of Patent: Feb. 18, 2020

(54) ABATEMENT AND STRIP PROCESS CHAMBER IN A LOAD LOCK CONFIGURATION

(71) Applicant: Applied Materials, Inc., Santa Clara, CA (US)

(72) Inventors: Martin Jeffrey Salinas, Campbell, CA (US); Paul B. Reuter, Austin, TX (US); Andrew Nguyen, San Jose, CA (US); Jared Ahmad Lee, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 948 days.

(21) Appl. No.: 13/746,831

(22) Filed: Jan. 22, 2013

(65) Prior Publication Data

US 2013/0224953 A1 Aug. 29, 2013

Related U.S. Application Data

(60) Provisional application No. 61/604,990, filed on Feb. 29, 2012.

(51) Int. Cl.
*H01L 21/67* (2006.01)
*H01L 21/306* (2006.01)
*H01L 21/02* (2006.01)

(52) U.S. Cl.
CPC ...... *H01L 21/306* (2013.01); *H01L 21/02063* (2013.01); *H01L 21/02071* (2013.01); *H01L 21/67167* (2013.01); *H01L 21/67201* (2013.01)

(58) Field of Classification Search
CPC ......... H01L 21/02063; H01L 21/02071; H01L 21/306; H01L 21/67201; H01L 21/67167
See application file for complete search history.

(56) References Cited

U.S. PATENT DOCUMENTS

| 4,139,051 A | 2/1979 | Jones et al. |
| 4,816,638 A | 3/1989 | Ukai et al. |

(Continued)

FOREIGN PATENT DOCUMENTS

| CN | 1722362 A | 1/2006 |
| CN | 1841652 A | 10/2006 |

(Continued)

OTHER PUBLICATIONS

The International Search Report and Written Opinion, dated May 10, 2013, PCT Application No. PCT/US2013/022228.

(Continued)

*Primary Examiner* — Yuechuan Yu
(74) *Attorney, Agent, or Firm* — Patterson + Sheridan, LLP

(57) ABSTRACT

Embodiments of the present invention a load lock chamber including two or more isolated chamber volumes, wherein one chamber volume is configured for processing a substrate and another chamber volume is configured to provide cooling to a substrate. One embodiment of the present invention provides a load lock chamber having at least two isolated chamber volumes formed in a chamber body assembly. The at least two isolated chamber volumes may be vertically stacked. A first chamber volume may be used to process a substrate disposed therein using reactive species. A second chamber volume may include a cooled substrate support.

20 Claims, 10 Drawing Sheets

(56) References Cited

U.S. PATENT DOCUMENTS

| | | | |
|---|---|---|---|
| 4,952,299 A | 8/1990 | Chrisos et al. | |
| 5,071,714 A | 12/1991 | Rodbell et al. | |
| 5,188,979 A | 2/1993 | Filipiak | |
| 5,198,634 A | 3/1993 | Mattson et al. | |
| 5,217,501 A | 6/1993 | Fuse et al. | |
| 5,332,443 A | 7/1994 | Chew et al. | |
| 5,337,207 A | 8/1994 | Jones et al. | |
| 5,356,833 A | 10/1994 | Maniar et al. | |
| 5,376,213 A | 12/1994 | Ueda et al. | |
| 5,522,937 A | 6/1996 | Chew et al. | |
| 5,545,289 A | 8/1996 | Chen et al. | |
| 5,571,367 A | 11/1996 | Nakajima et al. | |
| 5,633,073 A | 5/1997 | Cheung et al. | |
| 5,641,702 A | 6/1997 | Imai et al. | |
| 5,643,366 A | 7/1997 | Somekh et al. | |
| 5,753,133 A | 5/1998 | Wong et al. | |
| 5,753,891 A | 5/1998 | Iwata et al. | |
| 5,840,200 A | 11/1998 | Nakagawa et al. | |
| 5,895,549 A | 4/1999 | Goto et al. | |
| 5,904,799 A | 5/1999 | Donohoe | |
| 5,948,704 A | 9/1999 | Benjamin et al. | |
| 5,976,310 A | 11/1999 | Levy | |
| 6,000,227 A | 12/1999 | Kroeker | |
| 6,035,101 A | 3/2000 | Sajoto et al. | |
| 6,114,216 A | 9/2000 | Yieh et al. | |
| 6,136,211 A | 10/2000 | Qian et al. | |
| 6,143,082 A | 11/2000 | McInerney et al. | |
| 6,148,072 A | 11/2000 | Huang | |
| 6,204,141 B1 | 3/2001 | Lou | |
| 6,228,563 B1 | 5/2001 | Starov et al. | |
| 6,228,739 B1 | 5/2001 | Ha et al. | |
| 6,257,168 B1 | 7/2001 | Ni et al. | |
| 6,264,706 B1 | 7/2001 | Hirano | |
| 6,267,074 B1 | 7/2001 | Okumura | |
| 6,270,568 B1 | 8/2001 | Droopad et al. | |
| 6,270,582 B1 | 8/2001 | Rivkin et al. | |
| 6,297,095 B1 | 10/2001 | Muralidhar et al. | |
| 6,299,691 B1 | 10/2001 | Oda et al. | |
| 6,300,202 B1 | 10/2001 | Hobbs et al. | |
| 6,300,212 B1 | 10/2001 | Inoue et al. | |
| 6,319,730 B1 | 11/2001 | Ramdani et al. | |
| 6,326,261 B1 | 12/2001 | Tsang et al. | |
| 6,335,207 B1 | 1/2002 | Joo et al. | |
| 6,348,386 B1 | 2/2002 | Gilmer | |
| 6,358,859 B1 | 3/2002 | Lo et al. | |
| 6,375,746 B1 | 4/2002 | Stevens et al. | |
| 6,399,507 B1 | 6/2002 | Nallan et al. | |
| 6,414,280 B1 | 7/2002 | Nishitani et al. | |
| 6,431,807 B1 | 8/2002 | Stevens et al. | |
| 6,440,864 B1 | 8/2002 | Kropewnicki et al. | |
| 6,458,253 B2 | 10/2002 | Ando et al. | |
| 6,466,426 B1 | 10/2002 | Mok et al. | |
| 6,479,801 B1 | 11/2002 | Shigeoka et al. | |
| 6,485,988 B2 | 11/2002 | Ma et al. | |
| 6,514,378 B1 | 2/2003 | Ni et al. | |
| 6,528,427 B2 | 3/2003 | Chebi et al. | |
| 6,592,771 B1 | 7/2003 | Yamanaka et al. | |
| 6,616,767 B2 | 9/2003 | Zhao et al. | |
| 6,635,185 B2 | 10/2003 | Demmin et al. | |
| 6,688,375 B1* | 2/2004 | Turner | C23C 16/46 165/48.1 |
| 6,890,861 B1 | 5/2005 | Bosch | |
| 6,899,507 B2 | 5/2005 | Yamagishi et al. | |
| 6,935,466 B2 | 8/2005 | Lubomirsky | |
| 7,045,014 B2 | 5/2006 | Mahon et al. | |
| 7,207,766 B2 | 4/2007 | Kurita et al. | |
| 7,396,480 B2 | 7/2008 | Kao et al. | |
| 7,497,414 B2 | 3/2009 | Lee et al. | |
| 7,506,654 B2 | 3/2009 | Chandran et al. | |
| 7,695,232 B2 | 4/2010 | Moore et al. | |
| 7,732,728 B2 | 6/2010 | Dhindsa et al. | |
| 7,846,845 B2 | 12/2010 | Bahng et al. | |
| 8,033,769 B2 | 10/2011 | Gage et al. | |
| 8,060,252 B2* | 11/2011 | Gage et al. | 700/248 |
| 8,272,825 B2 | 9/2012 | Hofmeister et al. | |
| 8,662,812 B2 | 3/2014 | Hofmeister et al. | |
| 8,845,816 B2 | 9/2014 | Diaz et al. | |
| 8,992,689 B2 | 3/2015 | Diaz et al. | |
| 10,090,181 B2 | 10/2018 | Lee et al. | |
| 10,204,805 B2 | 2/2019 | Yousif et al. | |
| 2001/0055852 A1 | 12/2001 | Moise et al. | |
| 2002/0011207 A1* | 1/2002 | Uzawa et al. | 118/666 |
| 2002/0025375 A1* | 2/2002 | Takamori | H01L 21/67248 427/240 |
| 2002/0046810 A1 | 4/2002 | Tanaka et al. | |
| 2002/0074312 A1 | 6/2002 | Ou-Yang et al. | |
| 2002/0104751 A1 | 8/2002 | Drewery et al. | |
| 2002/0144786 A1 | 10/2002 | Chiang et al. | |
| 2003/0003696 A1 | 1/2003 | Gelatos et al. | |
| 2003/0045131 A1 | 3/2003 | Verbeke et al. | |
| 2003/0057179 A1 | 3/2003 | Luo et al. | |
| 2003/0092278 A1 | 5/2003 | Fink | |
| 2003/0159307 A1* | 8/2003 | Sago | H01L 21/67017 34/107 |
| 2003/0170986 A1 | 9/2003 | Nallan et al. | |
| 2004/0002223 A1 | 1/2004 | Nallan et al. | |
| 2004/0007176 A1 | 1/2004 | Janakiraman et al. | |
| 2004/0007561 A1 | 1/2004 | Nallan et al. | |
| 2004/0043544 A1 | 3/2004 | Asai et al. | |
| 2004/0177810 A1 | 9/2004 | Ohta | |
| 2004/0203251 A1 | 10/2004 | Kawaguchi et al. | |
| 2004/0226514 A1 | 11/2004 | Mahon et al. | |
| 2005/0183827 A1 | 8/2005 | White et al. | |
| 2005/0189074 A1 | 9/2005 | Kasai et al. | |
| 2005/0208714 A1 | 9/2005 | Yamazaki et al. | |
| 2005/0224181 A1 | 10/2005 | Merry et al. | |
| 2006/0105575 A1* | 5/2006 | Bailey, III | H01J 37/32522 438/706 |
| 2006/0231027 A1 | 10/2006 | Iwabuchi | |
| 2006/0234178 A1* | 10/2006 | Hayashi et al. | 432/198 |
| 2006/0245852 A1* | 11/2006 | Iwabuchi | H01L 21/67201 414/217 |
| 2007/0062558 A1 | 3/2007 | Suzuki et al. | |
| 2007/0102286 A1 | 5/2007 | Scheible et al. | |
| 2007/0140814 A1 | 6/2007 | Kurita et al. | |
| 2007/0151514 A1 | 7/2007 | Chen et al. | |
| 2007/0166133 A1 | 7/2007 | Lee et al. | |
| 2007/0240631 A1 | 10/2007 | Nijhawan et al. | |
| 2008/0019666 A1 | 1/2008 | Kato et al. | |
| 2008/0056857 A1 | 3/2008 | Hiroki | |
| 2008/0099040 A1 | 5/2008 | Bahng et al. | |
| 2008/0105650 A1 | 5/2008 | Sugai et al. | |
| 2009/0014324 A1 | 1/2009 | Kawaguchi et al. | |
| 2009/0028761 A1 | 1/2009 | Devine et al. | |
| 2009/0031955 A1 | 2/2009 | Lu et al. | |
| 2009/0067823 A1 | 3/2009 | Kusuda | |
| 2009/0127102 A1 | 5/2009 | Lee et al. | |
| 2009/0142167 A1 | 6/2009 | Gage et al. | |
| 2009/0179365 A1 | 7/2009 | Lerner et al. | |
| 2009/0191030 A1 | 7/2009 | Bluck et al. | |
| 2009/0200269 A1 | 8/2009 | Kadkhodayan et al. | |
| 2009/0206056 A1 | 8/2009 | Xu et al. | |
| 2009/0233449 A1 | 9/2009 | Lebouitz et al. | |
| 2010/0059478 A1 | 3/2010 | Lee et al. | |
| 2010/0133255 A1 | 6/2010 | Bahng et al. | |
| 2010/0147396 A1 | 6/2010 | Yamagishi et al. | |
| 2010/0190343 A1 | 7/2010 | Aggarwal et al. | |
| 2010/0288369 A1 | 11/2010 | Chang et al. | |
| 2011/0031214 A1 | 2/2011 | Kim et al. | |
| 2011/0052833 A1 | 3/2011 | Hanawa et al. | |
| 2011/0236600 A1 | 9/2011 | Fox et al. | |
| 2011/0287632 A1 | 11/2011 | Brown et al. | |
| 2011/0304078 A1* | 12/2011 | Lee | H01L 21/67201 264/344 |
| 2012/0222813 A1 | 9/2012 | Pal et al. | |
| 2012/0264051 A1 | 10/2012 | Angelov et al. | |
| 2013/0224953 A1 | 8/2013 | Salinas et al. | |
| 2013/0334199 A1 | 12/2013 | Yousif et al. | |
| 2013/0337655 A1 | 12/2013 | Lee et al. | |
| 2013/0340938 A1 | 12/2013 | Tappan et al. | |

(56) References Cited

U.S. PATENT DOCUMENTS

2014/0087561 A1 3/2014 Lee et al.
2018/0247850 A1 8/2018 Lee et al.

FOREIGN PATENT DOCUMENTS

| CN | 1943003 | A | 4/2007 |
|----|---------|---|--------|
| CN | 101145506 | A | 3/2008 |
| CN | 102243989 | A | 11/2011 |
| JP | 2002-158273 | A | 5/2002 |
| JP | 2003282462 | A | 10/2003 |
| JP | 2004241420 | A | 8/2004 |
| JP | 2004319540 | | 11/2004 |
| JP | 2008251991 | | 10/2005 |
| JP | 2006005348 | A | 1/2006 |
| JP | 2006506918 | A | 2/2006 |
| JP | 2006-303013 | A | 11/2006 |
| JP | 2007186757 | A | 7/2007 |
| JP | 2011011929 | A | 1/2011 |
| JP | 2011166107 | A | 8/2011 |
| JP | 2011174108 | A | 9/2011 |
| JP | 2012501549 | A | 1/2012 |
| KR | 20110009541 | A | 1/2011 |
| KR | 20110079832 | A | 7/2011 |
| KR | 20110092825 | A | 8/2011 |
| TW | 201118200 | A | 6/2011 |
| WO | 2012118897 | A2 | 9/2012 |

OTHER PUBLICATIONS

Japanese Office Action (with attached English translation) for Application No. 2013-556826; dated Jan. 19, 2016, 6 total pages.
Office Action and Search Report for Taiwan Application No. 101106559 (APPM/015751TW) dated Jan. 28, 2016, 8 pages (with translation).
Office Action and Search Report for Chinese Application No. 201280010528.6 (APPM/015751CNP) dated Jun. 30, 2015.
International Search Report and Written Opinion dated Sep. 12, 2012 for PCT/US2012/027135.
Chinese Office Action in related application CN 201380010918.8.
Japanese Office Action (with attached English translation) for Application No. 2014-559893; dated Nov. 15, 2016; 12 total pages.
Taiwanese Office Action (with attached English translation of the Search Report) for Application No. 102105282; dated Jul. 13, 2016; 6 total pages.
Japanese Office Action (with attached English translation) for Application No. 2014-559893; dated Oct. 3, 2017; 10 total pages.
Office Action from Japanese Patent Application No. 2014-559893 dated Sep. 4, 2018.
Office Action from Chinese Patent Application No. 201710107319.8 dated Febeuary 28, 2019.
Office Action from Korean Patent Application No. 10-2014-7027253 dated Jul. 10, 2019.

* cited by examiner

ABATEMENT AND STRIP PROCESS CHAMBER IN A LOAD LOCK CONFIGURATION

CROSS-REFERENCE TO RELATED APPLICATIONS

This application claims benefit of U.S. Provisional Patent Application Ser. No. 61/604,990, filed Feb. 29, 2012, which is herein incorporated by reference.

BACKGROUND

Field

Embodiment of the present invention generally relates to a method and apparatus for fabricating devices on a semiconductor substrate. More particularly, embodiments of the present invention relate to a load lock chamber including one chamber volume configured for processing a substrate.

Description of the Related Art

Ultra-large-scale integrated (ULSI) circuits may include more than one million electronic devices (e.g., transistors) that are formed on a semiconductor substrate, such as a silicon (Si) substrate, and cooperate to perform various functions within the device. Typically, the transistors used in the ULSI circuits are complementary metal-oxide-semiconductor (CMOS) field effect transistors.

Plasma etching is commonly used in the fabrication of transistors and other electronic devices. During plasma etch processes used to form transistor structures, one or more layers of a film stack (e.g., layers of silicon, polysilicon, hafnium dioxide ($HfO_2$), silicon dioxide ($SiO_2$), metal materials, and the like) are typically exposed to etchants comprising at least one halogen-containing gas, such as hydrogen bromide (HBr), chlorine ($Cl_2$), carbon tetrafluoride ($CF_4$), and the like. Such processes cause a halogen-containing residue to build up on the surfaces of the etched features, etch masks, and elsewhere on the substrate.

When exposed to a non-vacuumed environment (e.g., within factory interfaces or substrate storage cassettes) and/or during consecutive processing, gaseous halogens and halogen-based reactants (e.g., bromine ($Br_2$), chlorine ($Cl_2$), hydrogen chloride (HCl), and the like) may be released from the halogen-containing residues deposited during etching. The released halogens and halogen-based reactants create particle contamination and cause corrosion of the interior of the processing systems and factory interfaces, as well as corrosion of exposed portions of metallic layers on the substrate. Cleaning of the processing systems and factory interfaces and replacement of the corroded parts is a time consuming and expensive procedure.

Several processes have been developed to remove the halogen-containing residues on the etched substrates. For example, the etched substrate may be transferred into a remote plasma reactor to expose the etched substrate to a gas mixture that converts the halogen-containing residues to non-corrosive volatile compounds that may be out-gassed and pumped out of the reactor. However, such process requires a dedicated process chamber along with an additional step, causing increased tool expense, reduced manufacturing productivity and throughput, resulting in high manufacturing cost.

Therefore, there is a need for an improved method and apparatus for removing halogen-containing residues from a substrate.

SUMMARY

Embodiments of the present invention generally provide apparatus and methods for processing a substrate. Particularly, embodiments of the present inventions provide a load lock chamber capable of processing a substrate, for example by exposing the substrate positioned therein to a reactive species.

One embodiment of the present invention provides a load lock chamber. The load lock chamber includes a chamber body assembly defining a first chamber volume and a second chamber volume isolated from one another. The first chamber volume is selectively connectable to two environments through two openings configured for substrate transferring, and the second chamber volume is selectively connected to at least one of the two environments. The load lock chamber further includes a cooled substrate support assembly disposed in the first chamber volume and configured to support and cool a substrate thereon, a heated substrate support assembly disposed in the second chamber volume and configured to support a substrate thereon, and a gas distribution assembly disposed in the second chamber volume and configured to provide a processing gas to the second chamber volume for processing the substrate disposed therein.

One embodiment of the present invention provides a dual load lock chamber. The dual load lock chamber includes a first load lock chamber and a second load lock chamber disposed side by side in a unitary chamber body assembly. Each of the first load lock chamber and second load lock chamber includes a first chamber volume and a second chamber volume isolated from one another. The first chamber volume is selectively connectable to two environments through two openings configured for substrate transferring, and the second chamber volume is selectively connected to at least one of the two processing environments. Each load lock chamber also includes a cooled substrate support assembly disposed in the first chamber volume and configured to support and cool a substrate thereon, a heated substrate support assembly disposed in the second chamber volume and configured to support a substrate thereon, and a gas distribution assembly disposed in the second chamber volume and configured to provide a processing gas to the second chamber volume for processing the substrate disposed therein.

Yet another embodiment of the present invention provides a method for removing halogen-containing residues from a substrate. The method includes transferring a substrate to a substrate processing system through a first chamber volume of a load lock chamber coupled to a transfer chamber of the substrate processing system, etching the substrate in one or more processing chambers coupled to the transfer chamber of the substrate processing chamber with chemistry comprising halogen, removing halogen-containing residues from the etched substrate in a second chamber volume of the load lock chamber, and cooling a substrate in a cooled substrate support assembly of the load lock chamber after removing the halogen-containing residue.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
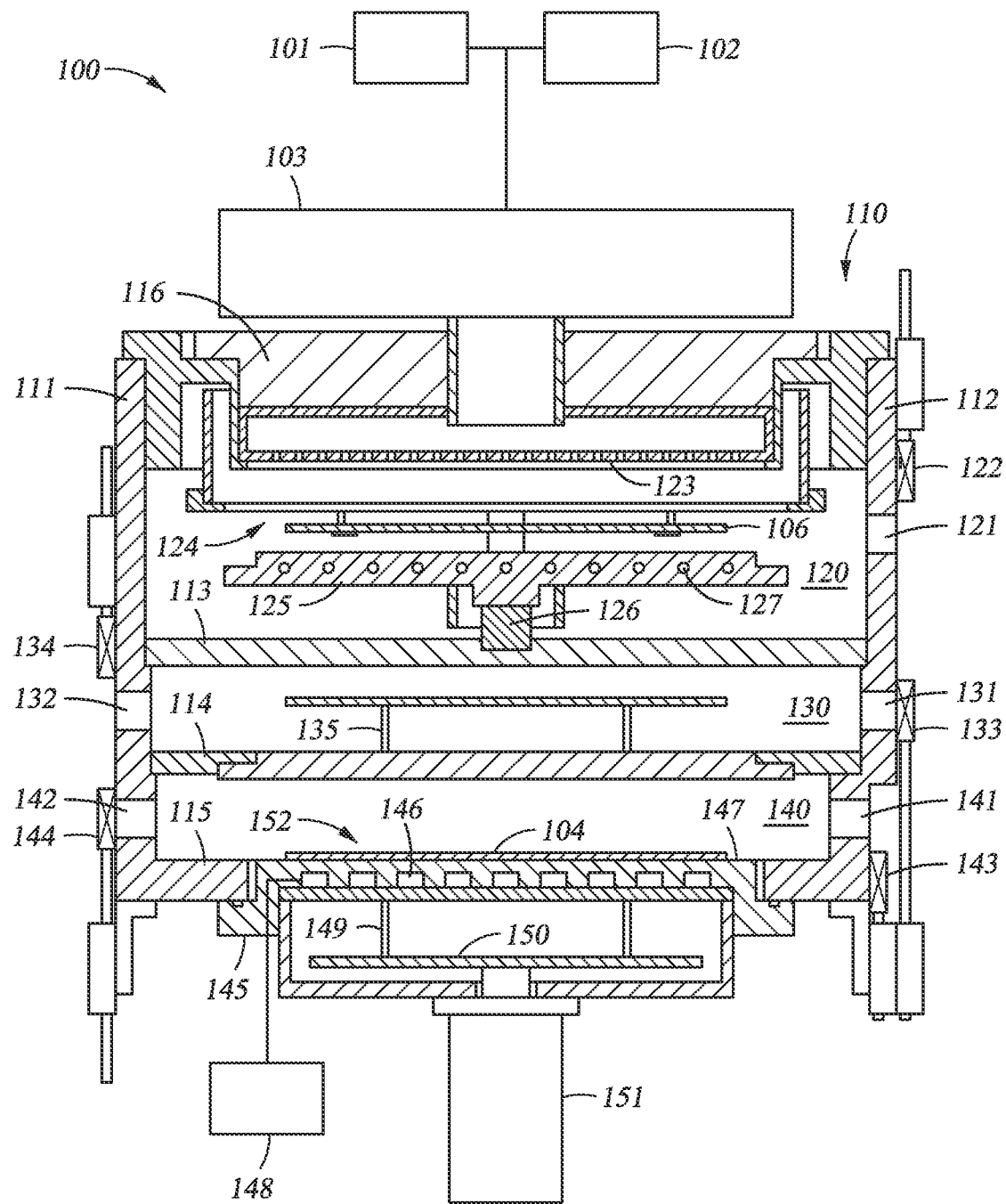
FIG. 1 is a schematic sectional view of a load lock chamber according to one embodiment of the present invention.

Embodiments of the present invention provide apparatus and methods for fabricating devices on a semiconductor substrate. More particularly, embodiments of the present invention provide a load lock chamber including two or more isolated chamber volumes, wherein one chamber volume is configured for processing a substrate and another chamber volume is configured to provide cooling to a substrate.

One embodiment of the present invention provides a load lock chamber having at least two isolated chamber volumes formed in a chamber body assembly. The at least two isolated chamber volumes may be vertically stacked. The two chamber volumes are independently operable to increase throughput. A first chamber volume may be used to process a substrate disposed therein using reactive species, for example removing halogen residual from the substrate or removing photoresist from the substrate. A second chamber volume has two openings for substrate exchange between adjoining environments, such as an ambient environment of a factory interface and a vacuum environment of a transfer chamber. In one embodiment, a cooled substrate support may be disposed in the second chamber volume. The cooled substrate support allows the processed substrates to be cooled down before exiting the vacuum environment, therefore, preventing undesirable reactions, such as silicon oxidation, which can result by exposing a warm substrate to the ambient atmosphere. In one embodiment, a substrate supporting shelf may be disposed in the second chamber volume to receive an additional substrate in the second chamber volume so that incoming and outgoing substrates may have separate slots to reduce cross contamination and improve throughput. By including a chamber volume for processing substrates in a load lock chamber, additional locations become available in a processing system to accommodate additional processing chambers, thus increasing throughput without increasing footprint of the processing system. Additionally, using a cooled substrate support in a load lock chamber improves process quality by reduce undesirable reactions when processed substrate are exposed to atmosphere.

Another embodiment of the present invention includes a load lock chamber having three chamber volumes. A third chamber volume may be stacked together between the first chamber volume for processing a substrate and the second chamber volume with the cooled substrate support. Similar to the second chamber volume, the third chamber volume has two openings for substrate exchange between adjoining isolated environments, such as an ambient environment of a factory interface and a vacuum environment of a transfer chamber. For example, the third chamber volume may be used to transfer incoming substrates from the factory interface to the transfer chamber while the second chamber volume may be used to transfer outgoing substrates from the transfer chamber to the factory interface. Because the incoming and outgoing substrates do not share the same chamber volume, potential for cross contamination is substantially eliminated. Furthermore, using separate chamber volumes for incoming and outgoing substrates also provides flexibility for the system.

FIG. 1 is a schematic sectional view of a load lock chamber 100 according to one embodiment of the present invention. The load lock chamber 100 has a chamber body assembly 110 defines three chamber volumes 140, 120 and 130. The three chamber volumes 140, 120, and 130 are vertically stacked together and are isolated from one another. The chamber volumes 130 and 140 are configured for transferring a substrate 104, and the chamber volume 120 is configured for processing a substrate 104.

In one embodiment, the chamber body assembly 110 includes a sidewall 111 and a sidewall 112. The sidewall 111 and the sidewall 112 face opposite directions to interface with two environments. The sidewall 111 may be adapted to connect to an ambient environment, such as present in a factory interface, while side wall 112 may be adapted to connect to a vacuum environment, such as a vacuum environment present in a transfer chamber. The load lock chamber 100 may be used to exchange substrates between the two environments connected to the sidewalls 111, 112. The chamber body assembly 110 may further include a chamber lid 116, a chamber bottom 115 and interior walls 113, 114. The interior walls 113, 114 divide the interior of the load lock chamber 100 into the three chamber volumes 120, 130, and 140. The chamber volumes 130, 140 function as load locks for substrate exchange and the chamber volume 120 is configured for processing a substrate.

The chamber volume 120 is defined between the sidewalls 111, 112, the chamber lid 116 and the interior wall 113. An opening 121 is formed through the sidewall 112 to allow a substrate to be transferred into and out of the chamber volume 120. A slit valve 122 is disposed to selectively seal the opening 121. In the embodiment shown in FIG. 1, the chamber volume 120 only has one opening 121 for substrate exchange, therefore, the chamber volume 120 cannot function as a load lock to exchange substrates between two environments. During operation, the chamber volume 120 may be selected connected to a vacuum processing environment via the opening 121. Optionally, an additional substrate exchange opening may be formed through the sidewall 111 to enable substrate exchange between the chamber volume 120 and the environment of the factory interface.

A heated substrate support assembly 125 is disposed in the chamber volume 120 for supporting and heating the substrate 104. According to one embodiment, the heated substrate support assembly 125 includes embedded heating elements 127. A thermal insulator 126 may be disposed between the heated substrate assembly 125 and the interior wall 113 to reduce thermal exchange between the chamber body assembly 110 and the heated substrate support assembly 125. A gas distribution showerhead 123 is disposed in the chamber volume 120 over the heated substrate support assembly 125. A lift hoop assembly 124 is movably disposed around the heated substrate support assembly 125 and the gas distribution showerhead 123. The lift hoop assembly 124 is configured to confine a processing environment within immediately around the substrate support assembly 125 in the chamber volume 120, as well as being operable to load and unload substrates from the heated substrate support assembly 125 and substrate transfer robots (not shown).

Gas panels 101, 102 may be used to provide processing gases to the chamber volume 120 through the gas distributing showerhead 123. In one embodiment, a remote plasma source 103 may be disposed between the gas planes 101, 102 and the gas distribution showerhead 123 so that dissociated species of processing gases may be supplied to the chamber volume 120. Alternatively, a RF power source may be applied between the gas distribution showerhead 123 and the heated substrate support assembly 125 to generate plasma within the chamber volume 120. In one embodiment, the gas panel 101 may provide processing gases for an abatement process to remove residual material after etching and the gas panel 102 may provide processing gases for an ashing process to remove photoresist.

A more detailed description of apparatus and methods for processing a substrate in a chamber volume of a load lock chamber can be found in U.S. Provisional Patent Application Ser. No. 61/448,027, filed Mar. 1, 2011, entitled "Abatement and Strip process Chamber in a Dual Loadlock Configuration.

The chamber volume 130 is defined by the interior walls 113, 114, and the sidewalls 111, 112. The chamber volume 130 is vertically stacked within the chamber body assembly 110 between the chamber volume 120 and chamber volume 140. Opening 131, 132 are formed through the sidewalls 112, 111 to allow substrate exchange between the chamber volume 130 and two environments outside the chamber body assembly 110. A slit valve 133 is disposed to selectively seal the opening 131. A slit valve 134 is disposed to selectively seal the opening 132. The chamber volume 130 may include a substrate support assembly having at least one substrate slot for holding or storing substrate thereon. In one embodiment, the chamber volume 130 includes three or more substrate supporting pins 135 for supporting a substrate 104 thereon. The three or more substrate supporting pins 135 may be fixedly positioned in the chamber volume 130. Other suitable substrate support, such as a shelf, an edge ring, brackets, may be positioned in the chamber volume 130 for supporting a substrate thereon.

The chamber volume 130 may serve as a load lock chamber and be used to exchange substrates between the two environments connected to the sidewalls 111, 112. The chamber volume 130 may also be used to store dummy substrates for testing or chamber cleaning.

The chamber volume 140 is defined by the sidewalls 111, 112, interior wall 114 and the chamber bottom 115. The chamber volume 140 is positioned below the chamber volume 130. Opening 141, 142 are formed through the sidewalls 112, 111 to allow substrate exchange between the chamber volume 140 and two environments outside the chamber body assembly 110. A slit valve 143 selectively seals the opening 141. A slit valve 144 selectively seals the opening 142. The slit valve 133 is designed not to obstruct the opening 141 while the slit valve 133 is positioned to seal the opening 131, as shown in FIG. 1. The openings 131, 141 may be opened and closed independently without affect one another. In one embodiment, the slit valve 133 may include a door coupled to an actuator through two poles positioned clear from the opening 141. The door of the slit valve 133 passes in front of the opening 141 during opening and closing. However, the opening 141 is unobstructed when the slit valve 133 is in closed position and the opened position. It should be noted, other suitable designs may be used to enable independent operation of the slit valves 133, 143.

A cooled substrate support assembly 152 is configured to support and cool a substrate 104 within the chamber volume 140. The cooled substrate support assembly 152 includes a disk shaped body 145 having a substrate supporting surface 147. A plurality of cooling channels 146 are formed in the disk shaped body 145. A cooling fluid source 148 may be coupled to the cooling channels 146 to control the temperature of the disk shaped body 145 and the substrate 104 disposed thereon. Lifting pins 149 may be used to lift the substrate 104 from the disk shaped body 145. The lifting pins 149 may be attached to a plate 150 coupled to an actuator 151.

The chamber volume 140 may serve as a load lock chamber and be used to exchange substrates between the two environments connected to the sidewalls 111, 112. The cooled substrate support assembly 152 provides cooling to the substrate 104 while passing the chamber volume 140.

Figure 2:
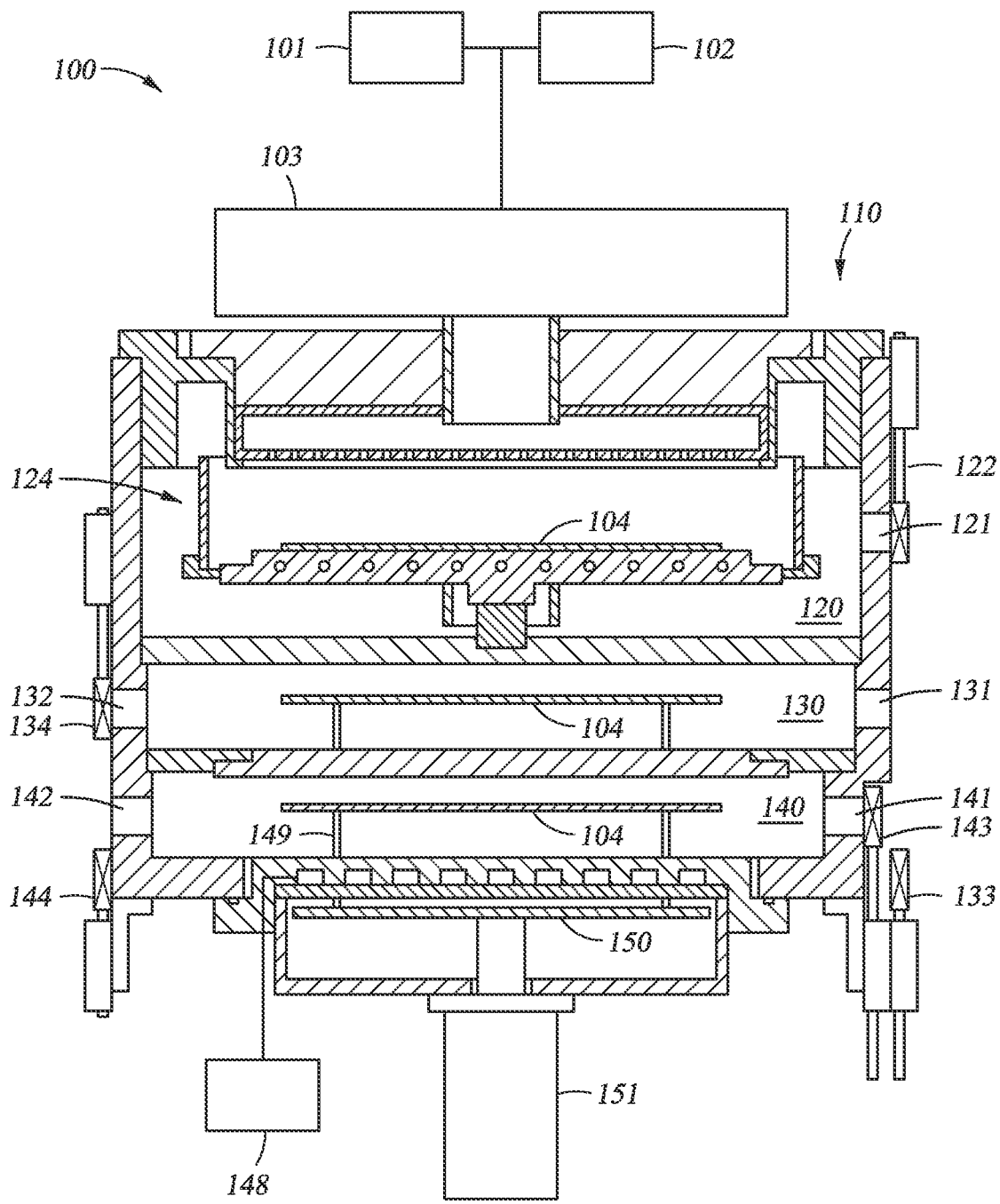
FIG. 2 is a schematic sectional view of the load lock chamber of FIG. 1 in a different status than in FIG. 1.

FIG. 2 is a schematic sectional view of the load lock chamber 100 wherein each chamber volume 120, 130, 140 are in a different state than as shown in FIG. 1. In FIG. 1, the chamber volume 120 is in substrate loading/unloading state with the lift hoop assembly 124 raised and the slit valve 122 opened. In FIG. 2, the chamber volume 120 is in processing position with the lift hoop assembly 124 lowered to confine a processing volume around the substrate 104 and the slit valve 122 closed. In FIG. 1, the chamber volume 130 is open to the ambient environment connected to the sidewall 111 with the slit valve 134 being open and the slit valve 133 being closed. In FIG. 2, the chamber volume 130 is open to the vacuum environment connected to the sidewall 112 with the slit valve 134 being closed and slit valve 133 being open. In FIG. 1, the chamber volume 140 is open to the vacuum environment connected to the sidewall 112 with the slit value 143 being closed and the slit valve 144 being closed. The substrate 104 rests on the cooled substrate support assembly 152 to be cooled. In FIG. 2, the chamber volume 140 is open to the ambient environment connected to the sidewall 111 with the slit valve 143 being open and the slit valve 144 being closed. The lift pins 149 are raised to position the substrate 104 in a loading/unloading position aligned with the opening 141.

The load lock chamber 100 may be used in a substrate processing system to provide an interface between a processing environment and a factory interface. Compared to traditional load lock chambers, the load lock chamber 100 may provide several improvements to a substrate processing system. First, by having a substrate processing chamber volume stacked over chamber volumes for load lock, the load lock chamber 100 frees space to allow an additional processing tool to be coupled to the vacuum transfer chamber, thus improves system throughput without increasing the foot print of the processing system. By dedicating the chamber volume 120 to processing, the need to pump the chamber volume 120 from atmosphere to vacuum state is eliminated, therefore improving processing throughput. Second, by having two chamber volumes as load lock, the load lock chamber 100 may provide separate paths for incoming and outgoing substrates, thus, substantially avoiding cross contamination between pre-processed and post-processed substrates. Third, by providing in a cooled substrate support assembly in a chamber volume, the load lock chamber 100 may provide cooling to a processed substrate before the processed substrate exits the processing system. The load lock chamber 100 reduces undesirable reactions on processed substrates because cooled substrates are less likely to react with atmosphere environment after exiting the processing system.

Figure 3:
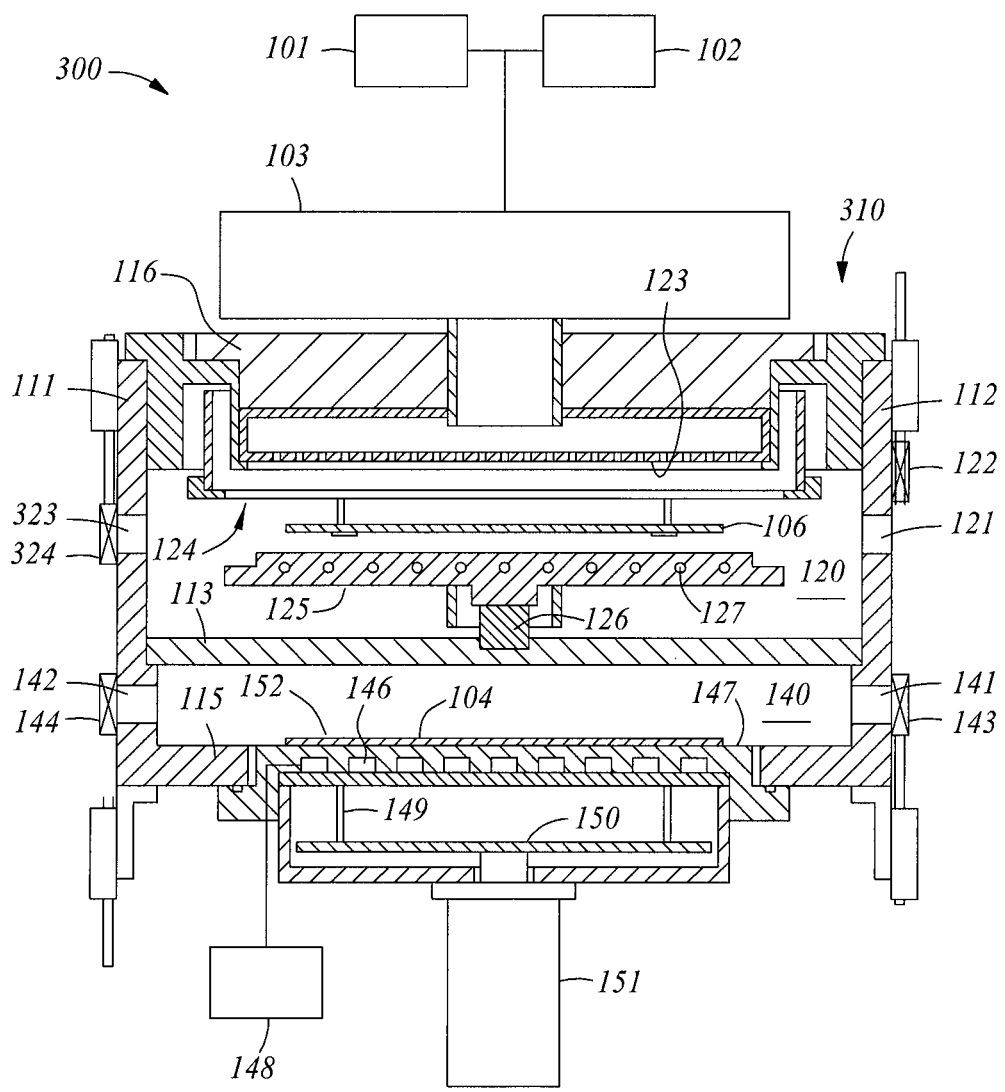
FIG. 3 is a schematic sectional view of a load lock chamber according to another embodiment of the present invention.

FIG. 3 is a schematic sectional view of a load lock chamber 300 according to another embodiment of the present invention. The load lock chamber 300 is similar to the load lock chamber 100 of FIGS. 1 and 2 except that a chamber body assembly 310 of the load lock chamber 300 does not include the chamber volume 130 disposed between the chamber volumes 120 and 140. In the load lock chamber 300, the chamber volume 140 may be used as a load lock for both incoming and outgoing substrates. Alternatively, the chamber volume 120 may be used as a load lock using a second opening 323 formed through the sidewall 111 and a slit valve 324 configured to selectively seal the opening 323. Compared to the load lock chamber 100, the load lock chamber 300 has fewer components, therefore, cost less and may be easier to maintain.

Figure 4:
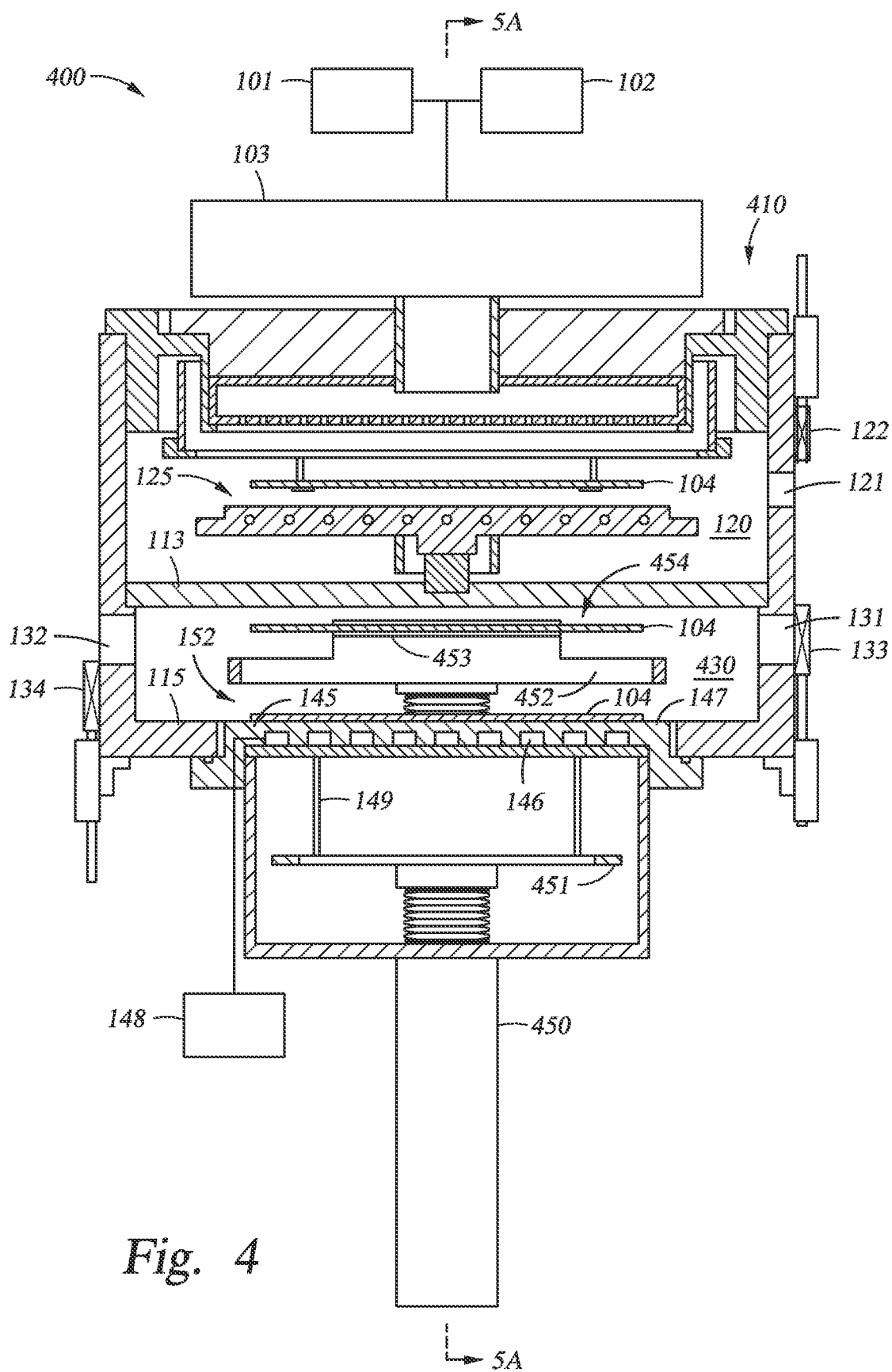
FIG. 4 is a schematic sectional view of a load lock chamber according to another embodiment of the present invention.

FIG. 4 is a schematic sectional view of a load lock chamber 400 according to another embodiment of the present invention. Similar to the load lock chamber 300, a chamber body assembly 410 of the load lock chamber 400 defines two chamber volumes, a chamber volume 430 positioned below the chamber volume 120. The chamber volume 120 may be dedicated to substrate processing and may only open to one side of the load lock chamber 400 via the opening 121 as the chamber volume 120 always remains under vacuum.

The chamber volume 430 may include a substrate supporting shelf 454 disposed above the cooled substrate support assembly 152 and configured to support a substrate 104 thereon. The chamber volume 430 may be used to hold one substrate 104 on the substrate supporting shelf 454 and to hold and/or cool another substrate 104 on the cooled substrate support assembly 152. In one embodiment, the substrate supporting shelf 454 may be dedicated for incoming substrates and the cooled substrate support assembly 152 for outgoing substrates, so that as to substantially eliminate potential for direct contamination between the incoming and outgoing substrates. Alternatively, the chamber volume 430 may be used to transfer two substrates simultaneously.

In one embodiment, the substrate supporting shelf 454 may be movably disposed over the cooled substrate support assembly 152 to enable substrate exchange. As shown in FIG. 4, the substrate supporting shelf 454 may include one or more posts 453 extending from a ring 452. The posts 453 are configured to provide support to a substrate 104. The ring 452 may be coupled to a lift assembly 450 to move the one or more posts 453 vertically within the chamber volume 430. In one embodiment, the lift assembly 450 may be also coupled to a ring 451 connected to the lift pins 149 for raising a substrate from or lowering a substrate to the cooled substrate support assembly 152. In one embodiment, the lift assembly 450 may be configured to move the substrate supporting shelf 454 and the lift pins 140 simultaneously. When the lift pins 149 raise to pick up the substrate 104 disposed on the cooled substrate support 152, the substrate supporting shelf 454 also moves up to ensure enough spacing between the substrate 104 on the lift pins 149 and the substrate supporting shelf 454 for loading or unloading.

Figure 5A:
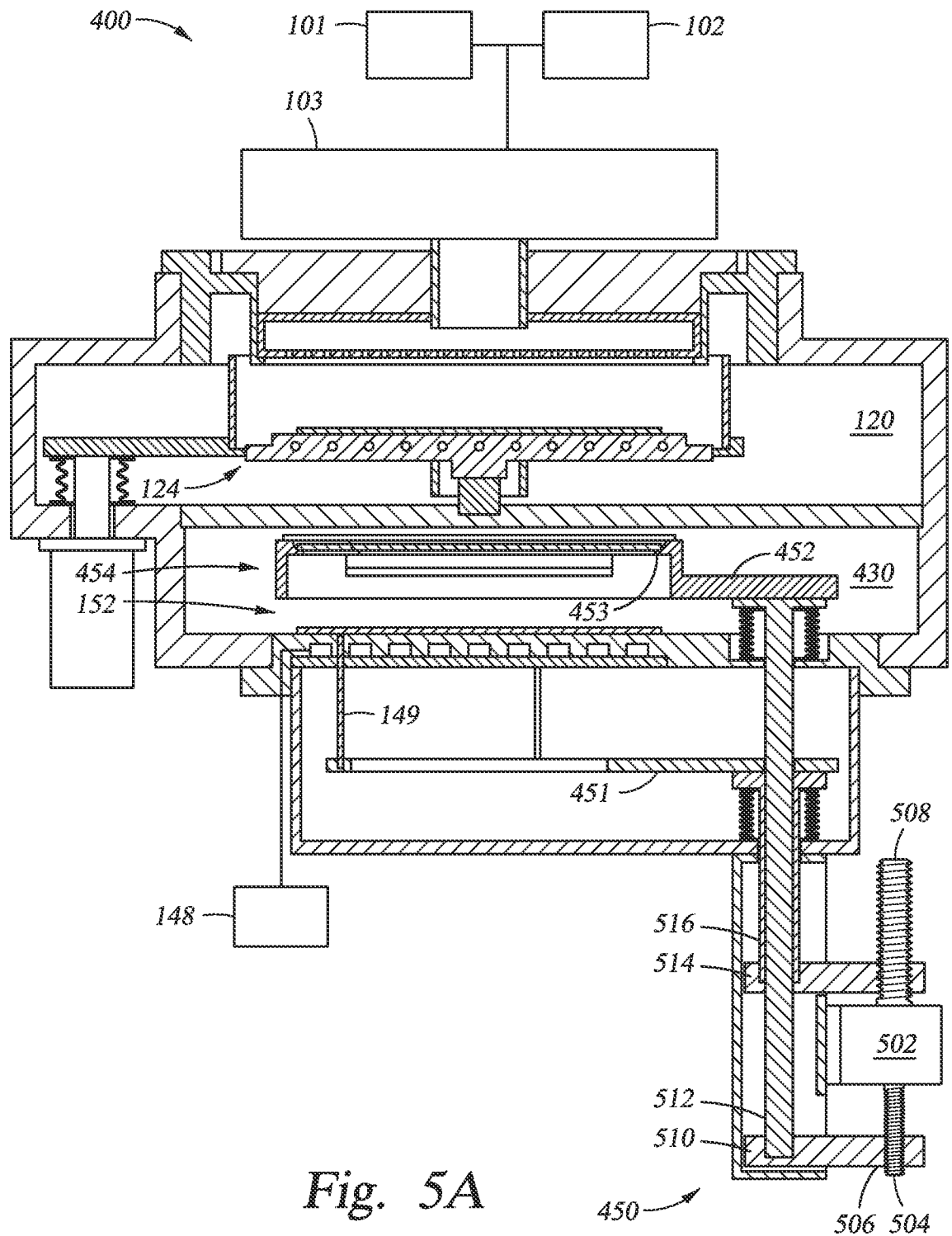
FIG. 5A is a schematic sectional view of the load lock chamber of FIG. 4 showing a lift assembly.
Figure 5B:
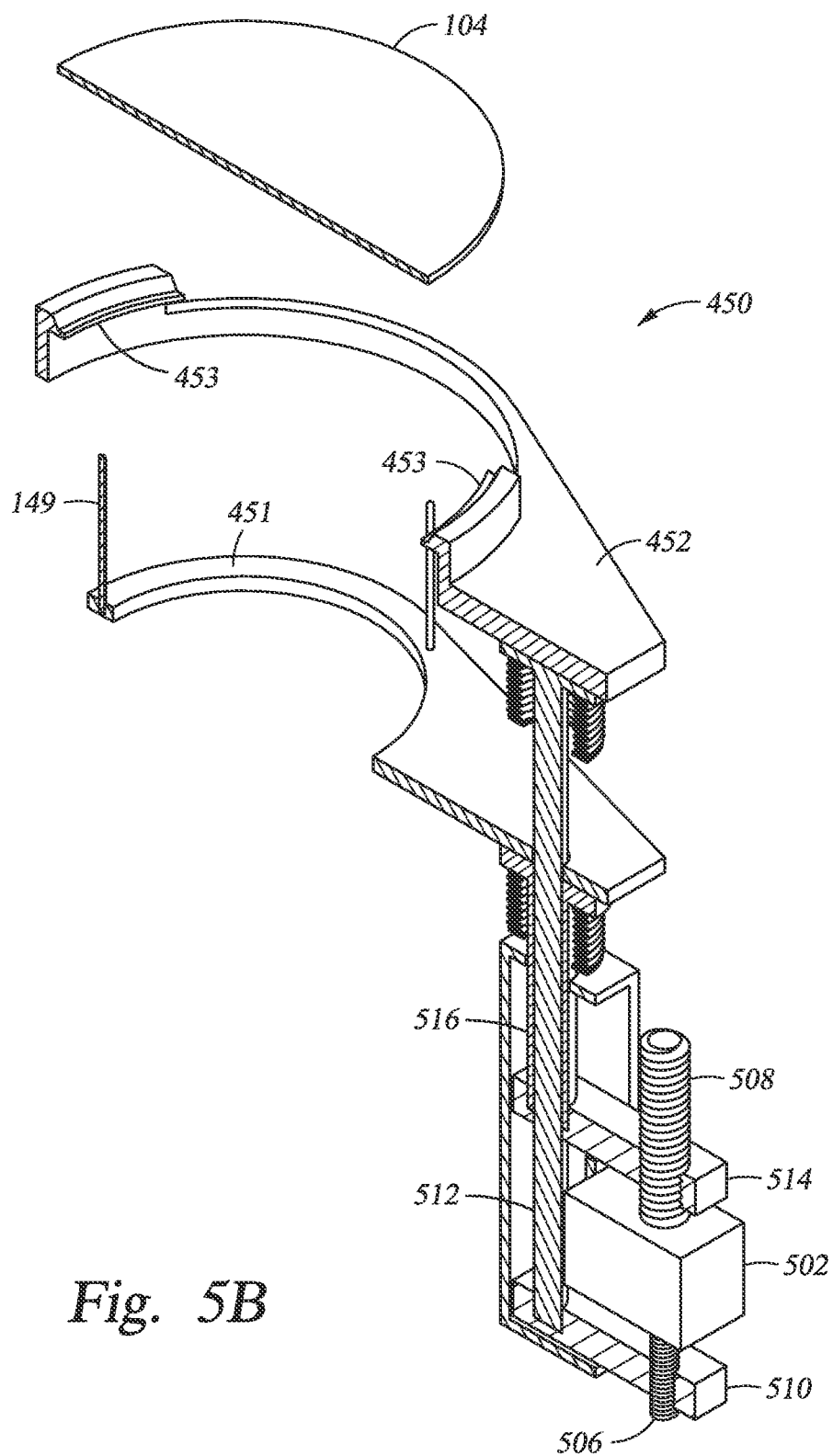
FIG. 5B is a schematic perspective view of a lift assembly according to one embodiment of the present invention.

FIG. 5A is a schematic sectional view of the load lock chamber 400 of FIG. 4 showing the lift assembly 450 and FIG. 5B is a schematic perspective view of the lift assembly 450. The lift assembly 450 may include a motor 502 coupled to a shaft 504 and configured to rotate the shaft 504. The shaft 504 may have threaded portions 506 and 508 for driving the substrate supporting shelf 454 and the lift pins 149 respectively. A threaded member 510 is coupled to the threaded portion 506 so that rotation of the shaft 504 moves the threaded member 510 along the shaft 504. A shaft 512 may be fixedly coupled between the threaded member 510 and the ring 452 to translate the vertical motion of the threaded member 510 to the ring 452 and the posts 453. Similarly, a threaded member 514 is coupled to the threaded portion 508 so that rotation of the shaft 504 moves the threaded member 514 along the shaft 504. A shaft 516 may be fixedly coupled between the threaded member 514 and the ring 451 to translate the vertical motion of the threaded member 514 to the ring 451 and the lift pins 149. In one embodiment, the shafts 512, 516 may be concentrically disposed as shown in FIG. 5A. Alternatively, the shafts 512, 516 may be disposed apart from one another.

In one embodiment, the threaded portions 506 and 508 may have different pitches so that the threaded members 510, 514 move at different speeds (and thus distances) when the shaft 504 is rotated by the motor 502. In one embodiment, pitches of the threaded portions 506 and 508 may be set so that the lift pins 149 moves faster than the substrate supporting shelf 454, thus, the substrate supporting shelf 454 has a smaller range of motion than the lift pins 149. By moving the substrate support shelf 454 and the lift pins 149 in distances as short as possible, the height of the chamber volume 430 can be minimized, thereby reducing pumping time and requirements. In one embodiment, the lift pins 149 move about twice as fast as the substrate supporting shelf 454.

The load lock chamber 400 may provide the chamber volumes 120 dedicated to processing substrates (i.e., no direct path to ambient environments), while provide cooling and separated paths for incoming and outgoing substrates to reduce cross contamination. Therefore, the load lock chamber 400 may be used to increase throughput, reduce contamination, and reduce undesired reactions on hot substrates.

Figure 6:
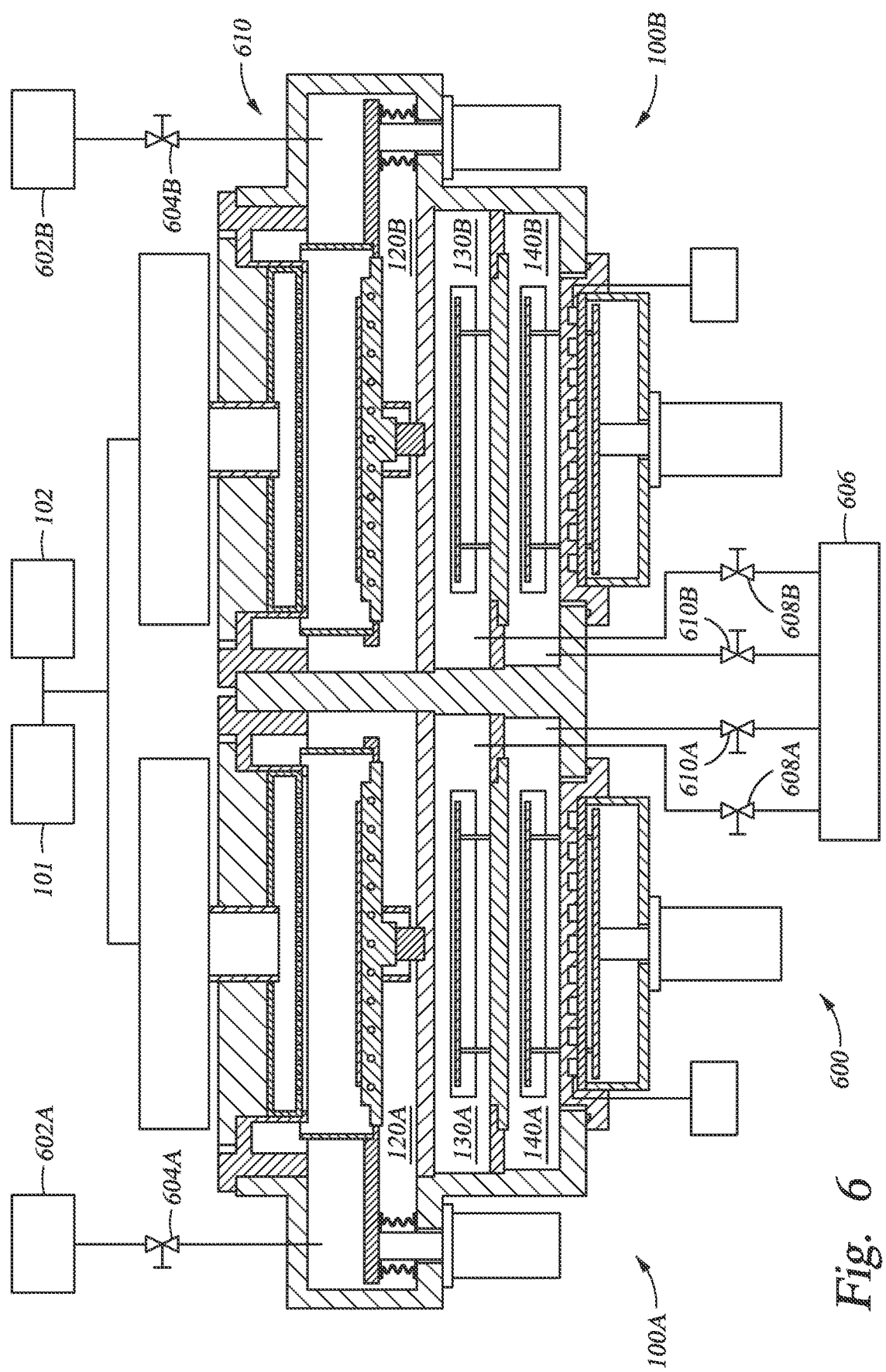
FIG. 6 is a schematic sectional view of a twin load lock chamber configuration according to one embodiment of the present invention.

Load lock chambers according to embodiments of the present invention may be used in pairs to double the productivity. FIG. 6 is a schematic sectional view of a twin load lock chamber 600 configuration according to one embodiment of the present invention. The twin load lock chamber 600 includes two load lock chambers 100A, 100B disposed side by side in a unitary chamber body assembly 610. As shown in FIG. 6, the two load lock chambers 100A, 100B may be mirror image of one another. The load lock chambers 100A, 100B may operate independently from one another or in synchronicity.

The load lock chambers 100A, 100B are similar to the load lock chamber 100 of FIG. 1. The load lock chamber 100A includes chamber volumes 120A, 130A, 140A and the load lock chamber 100B includes chamber volumes 120B, 130B, 140B. The load lock chambers 100A, 100B may share the gas sources 101, 102 for processing substrates in the chamber volumes 120A, 120B. Each chamber volume 120A, 120B may be coupled to a vacuum pump 602A, 602B through control valves 604A, 604B. The vacuum pumps 602A, 602B are configured to maintain a vacuum environment in the chamber volumes 120A, 120B. The chamber volumes 130A, 140A, 130B, 140B function as load lock volumes for substrate exchange. In one embodiment, the chamber volumes 130A, 140A, 130B, 140B may share one vacuum pump 606. Control valves 608A, 610A, 608B, 610B may be coupled between the vacuum pump 606 and the chamber volumes 130A, 140A, 130B, 140B to enable independent control.

Figure 7:
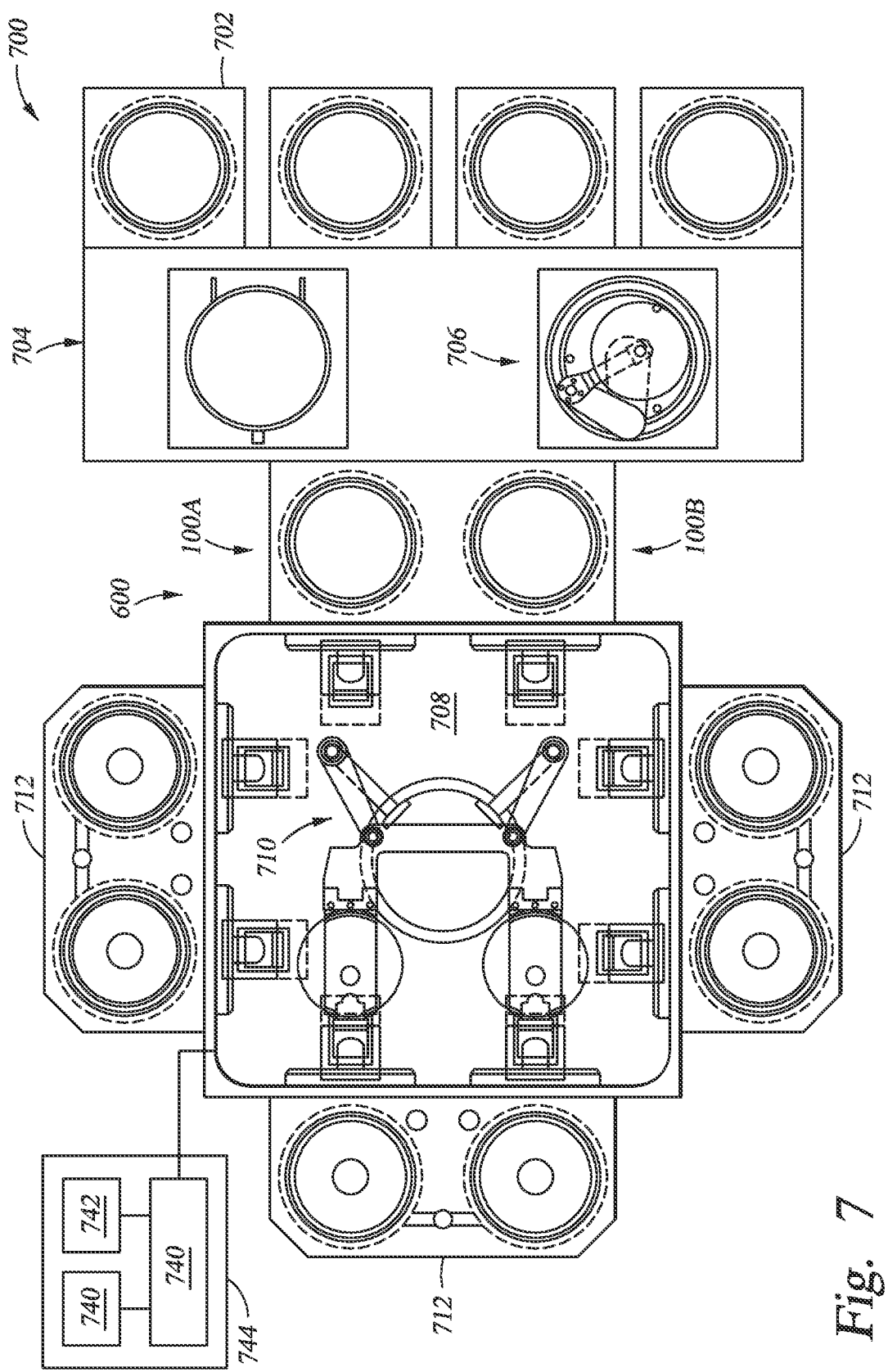
FIG. 7 is a plan view of a cluster tool system including load lock chambers according to one embodiment of the present invention.

The load lock chambers according to embodiments of the present invention may be used to provide interface between a substrate processing system and a factory interface in a cluster tool. FIG. 7 is a plan view of a cluster tool system 700 including load lock chambers according to one embodiment of the present invention. The cluster tool system 700 includes one or more load lock chambers according to embodiments of the present invention. The cluster tool system 700 of FIG. 7 is shown incorporating the twin load lock chamber 600. However, it should be noted that load lock chambers 100, 300 and 400 can also be utilized.

The cluster tool system 700 includes a system controller 744, a plurality of processing chambers 712 and the twin load-lock chamber 600 that are coupled to a vacuum substrate transfer chamber 708. In one embodiment, the transfer chamber 708 may have multiple sides and each side is configured to connect with a twin processing chamber 712 or the twin load lock chamber 600. As shown in FIG. 7, three twin processing chambers 712 are coupled to the transfer chamber 708. The twin load lock chamber 600 is coupled to the transfer chamber 708. A factory interface 704 is selectively coupled to the transfer chamber 708 by the load lock chambers 100A, 1008 of the twin load lock chamber 600.

The factory interface 704 may include at least one docking station 702 and at least one factory interface robot 706 to facilitate transfer of substrates. Each of the load lock chambers 100A, 100B of the twin load lock chamber 600 have two ports coupled to the factory interface 704 and three ports coupled to the transfer chamber 708. The load lock chambers 100A, 100B are coupled to a pressure control system (not shown) which pumps down and vents chamber volumes in the load lock chambers 100A, 100B to facilitate substrate exchange between the vacuum environment of the transfer chamber 708 and the substantially ambient (e.g., atmospheric) environment of the factory interface 704.

The transfer chamber 708 has a vacuum robot 710 disposed therein for transferring substrates among the load lock chambers 100A, 1008 and the processing chambers 712. In one embodiment, the vacuum robot 710 has two blades and is capable of simultaneously transferring two substrates among the load lock chambers 100A, 100B and the processing chambers 712.

In one embodiment, at least one process chambers 712 is an etch chamber. For example, the etch chamber may be a Decoupled Plasma Source (DPS) chamber available from Applied Materials, Inc. The DPS etch chamber uses an inductive source to produce high-density plasma and comprises a source of radio-frequency (RF) power to bias the substrate. Alternatively, at least one of the process chambers 712 may be one of a HART™, E-MAX®, DPS®, DPS II, PRODUCER E, or ENABLER® etch chamber also available from Applied Materials, Inc. Other etch chambers, including those from other manufacturers, may be utilized. The etch chambers may use a halogen-containing gas to etch the substrate 924 therein. Examples of halogen-containing gas include hydrogen bromide (HBr), chlorine ($Cl_2$), carbon tetrafluoride ($CF_4$), and the like. After etching the substrate 924, halogen-containing residues may be left on the substrate surface.

The halogen-containing residues may be removed by a thermal abatement process in at least one of the load lock chambers 100A, 100B. For example, a thermal treatment process may be performed in one or both of the chamber volumes 120A, 120B of the load lock chambers 100A, 100B. Alternatively or in addition to an abatement process, an ashing process may be performed in one or both of the chamber volumes 120A, 120B of the load lock chambers 100A, 100B.

The system controller 744 is coupled to the cluster tool system 700. The system controller 744 controls the operation of the cluster tool system 700 using a direct control of the process chambers 712 or alternatively, by controlling the computers (or controllers) associated with the processing chambers 712 and the cluster tool system 700. In operation, the system controller 744 enables data collection and feedback from the respective chambers and system controller 744 to optimize performance of the cluster tool system 700. The system controller 744 generally includes a central processing unit (CPU) 738, a memory 740, and support circuit 742.

Figure 8:
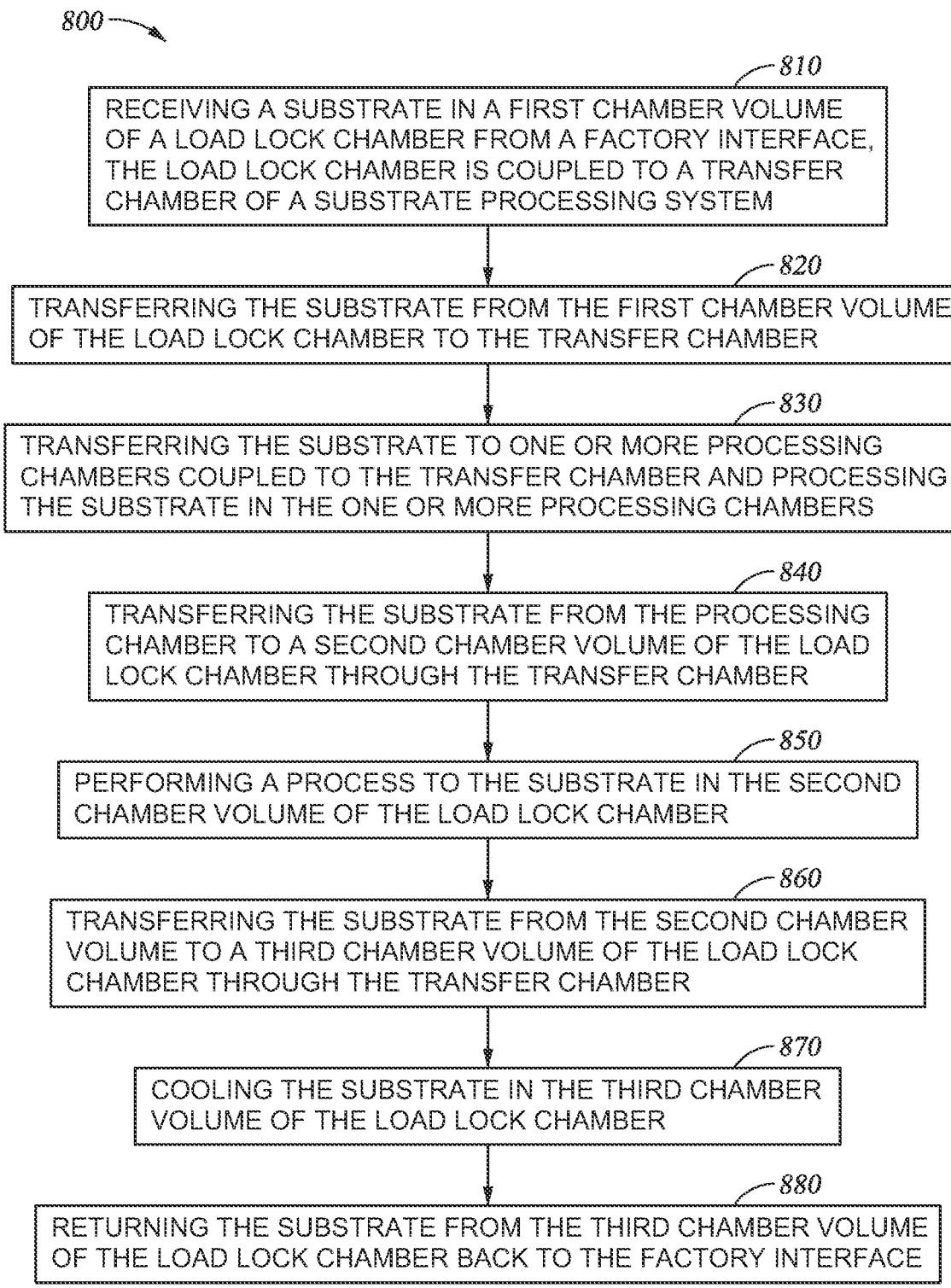
FIG. 8 is a flow diagram illustrating a method for processing a substrate according to one embodiment of the present invention.

FIG. 8 is a flow diagram illustrating a method 800 for processing a substrate according to one embodiment of the present invention. The method 800 may be performed in the cluster tool system 700 in FIG. 7 having load lock chambers 100A, 100B with three chamber volumes. It is contemplated that the method 800 may be performed in other suitable processing systems, including those from other manufacturers.

The method 800 begins at box 810 by receiving a substrate having a layer disposed thereon from a factory interface, such as the factory interface 704 in FIG. 7, in a first chamber volume of a load lock chamber coupled to the factory interface, such as the chamber volume 130A or 130B of the load lock chamber 100A or 100B.

At box 820, the first chamber volume containing the substrate may be pumped down to a vacuum level equal to that of a transfer chamber coupled to the load lock chamber. The substrate is then transferred from the load lock chamber to the transfer chamber. In one embodiment, the first chamber volume of the load lock chamber may be dedicated to provide paths to incoming substrates only.

At box 830, the substrate is transferred to one or more processing chambers coupled to the transfer chamber for one or more processes. The processes may include etching one or more films, such as a polymer film, on the substrates under a patterned mask using a halogen-containing gas. The patterned mask may include photoresist and/or hard mask. Suitable examples of halogen-containing gas include, but not limited to, hydrogen bromide (HBr), chlorine ($Cl_2$), carbon tetrafluoride ($CF_4$), and the like. The etching processes may leave halogen containing residue on the substrate.

Optionally, the substrate may be transferred from the first chamber volume of the load lock chamber to a second chamber volume of the load lock chamber through the transfer chamber for a pre-heating prior to being processed in the processing chambers. For example, the substrate may be transferred from the chamber volume 130 to the chamber volume 120 to be pre-heated on the heated substrate support 125. In one embodiment, the substrate may be preheated to a temperature between about 20 degrees Celsius and about 400 degrees Celsius.

At box 840, after being processed in one or more processing chambers connected to the transfer chamber, the substrate is transferred to the second chamber volume of the load lock chamber. The second chamber volume, such as the chamber volume 120 of the load lock chamber 100, may be dedicated to substrate processing. Depending on processing recipe, the second chamber volume of the load lock chamber may be configured to different processes.

At box 850, thermal treatment process may be performed on a the substrate to remove the halogen-containing residues from the substrate generated during processing of box 830 prior to exposure to atmospheric conditions in the factory interface or other locations. For example, the substrate may be transferred to the chamber volume 120 of the load lock chamber 100 to remove the halogen containing residues.

In one embodiment, a thermal treatment may be performed to etched substrate in the second chamber volume of the load lock chamber to remove the halogen-containing residues. For example, the substrate may be placed on the heated substrate support assembly 125 of the chamber volume 120 of the load lock chamber 100. The heated substrate support assembly 125 heats the substrate to a temperature between about 20 degrees Celsius and about 1000 degrees Celsius, such as between about 150 degrees Celsius and about 300 degrees Celsius, for example about 250 degrees Celsius, at between about 5 seconds and about 30 seconds. The rapid heating of the substrate by heated substrate support assembly 125 allows the halogen-containing residues on the etched substrate to be removed without increasing process cycle time which would be encountered if the residues were removed in one of the processing chambers. In one embodiment, the substrate may be heated by the heated substrate support assembly 125 at a predetermined time period until the halogen-containing residues are removed from the etched substrate.

In another embodiment, plasma of a gas mixture may be used to promote the conversion of the halogen containing residues into non-corrosive volatile compounds, thereby increasing the removal efficiency of the halogen-containing residues from the etched substrate surface. The gas mixture may include an oxygen-containing gas, such as $O_2$, $O_3$, water vapor ($H_2O$), a hydrogen-containing gas, such as $H_2$, forming gas, water vapor ($H_2O$), alkanes, alkenes, and the like, or an inert gas, such as a nitrogen gas ($N_2$), argon (Ar), helium (He), and the like. For example, the gas mixture may include oxygen, nitrogen, and a hydrogen-containing gas. In one embodiment, the hydrogen-containing gas is at least one of hydrogen ($H_2$) and water vapor ($H_2O$).

In another embodiment, the thermal treatment process may be in the form of an ashing process performed in a chamber volume of the load lock chamber after the substrate being etched in the cluster tool system to remove the mask layers or a photoresist layer from the substrate. During an ashing process, an oxygen-based plasma may be supplied to the chamber volume of the load lock chamber while the temperature of the substrate may be maintained at 15 to 300 degrees Celsius. Various oxidizing gases can be used including, but not limited to, $O_2$ $O_3$, $N_2O$, $H_2O$, CO, $CO_2$, alcohols, and various combinations of these gases. In other embodiments of the invention, nonoxidizing gases may be used including, but not limited to, $N_2$, $H_2O$, $H_2$, forming gas, $NH_3$, $CH_4$, $C_2H_6$, various halogenated gases ($CF_4$, $NF_3$, $C_2F_6$, $C_4F_8$, $CH_3F$, $CH_2F_2$, $CHF_3$), combinations of these gases and the like. In another embodiment, mask and/or photoresist layer may be stripped simultaneously at box 850.

At box 860, the substrate may be transferred from the second chamber volume of the load lock chamber to a third chamber volume of the load lock chamber through the transfer chamber. The third chamber volume of the load lock chamber may be dedicated to provide path to outgoing substrates. The third chamber volume may be chamber volume 140 of the load lock chamber 100.

At box 870, the substrate is cooled in the third chamber volume of the load lock chamber. The substrate may be lowered to a cooled substrate support assembly, such as the cooled substrate support assembly 152 of the load lock chamber 100, for cooling.

At box 880, the third chamber volume is vented to atmosphere pressure and the cooled substrate is returned to the factory interface. Since the substrate is cooled prior to exposing to atmosphere, undesirable reactions, such as silicon oxidation, are reduced.

Figure 9:
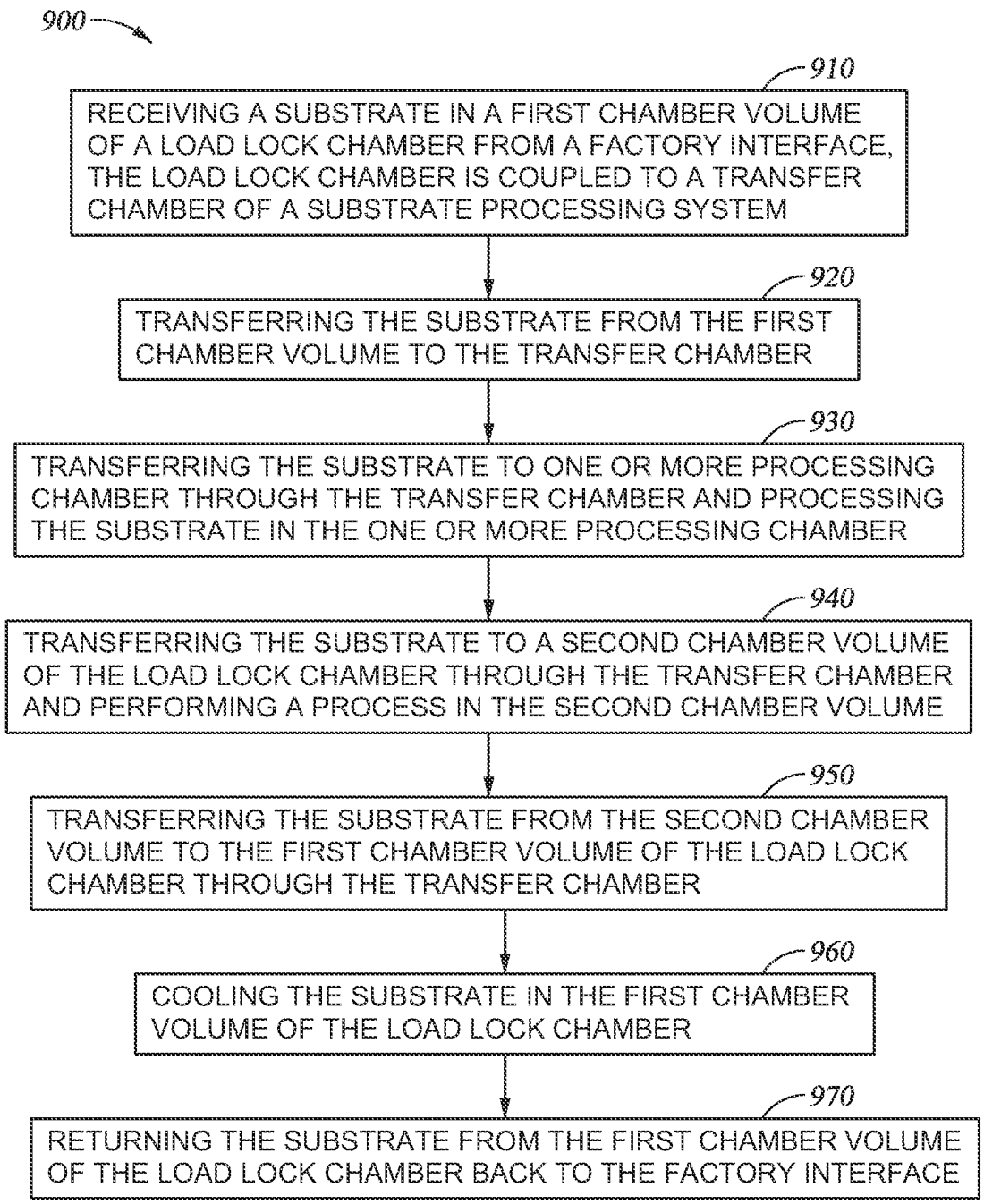
FIG. 9 is a flow diagram illustrating a method for processing a substrate according to another embodiment of the present invention.

FIG. 9 is a flow diagram illustrating a method 900 for processing a substrate according to another embodiment of the present invention. The method 900 is similar to the method 800, except the method 900 is performed in a cluster tool having load lock chambers with two chamber volumes, such as load lock chambers 300, 400 described above.

At box 910, a substrate having a layer disposed thereon is transferred from a factory interface, such as the factory interface 704 in FIG. 7, to a first chamber volume of a load lock chamber coupled to the factory interface. In one embodiment, when the load lock chamber 300 is used, the substrate may be transferred to the chamber volume 140 so that the chamber volume 120 can be dedicated to processing substrates. In another embodiment, when the load lock chamber 400 is used, the substrate may be transferred to the substrate supporting shelf 454 of the chamber volume 430.

At box 920, the first chamber volume containing the substrate may be pumped down to a vacuum level equal to that of a transfer chamber coupled to the load lock chamber. The substrate is then transferred from the load lock chamber to the transfer chamber.

At box 930, similar to the box 830 of the method 800, the substrate is transferred to one or more processing chambers coupled to the transfer chamber for one or more processes. The processes may include etching one or more films, such as a polymer film, on the substrates under a patterned mask using a halogen-containing gas.

At box 940, after being processed in one or more processing chambers connected to the transfer chamber, the substrate is transferred to the second chamber volume of the load lock chamber to remove residues and/or hard mask or photoresist. The second chamber volume, such as the chamber volume 120 of the load lock chamber 300 or the load lock chamber 400, may be dedicated to substrate processing. Depending on the process recipe, the second chamber volume of the load lock chamber may be configured to different processes. Similar to the processes described at box 850, a stripping process, an ashing process, or both stripping and ashing processes may be performed to the substrate to remove any desired combination of the halogen-containing residues, hard mask, and photoresist.

At box 950, the substrate may be transferred from the second chamber volume of the load lock chamber back to the chamber volume of the load lock chamber through the transfer chamber to be cooled.

At box 960, the substrate is cooled in the first chamber volume of the load lock chamber. The substrate may be lowered to a cooled substrate support assembly, such as the cooled substrate support assembly 152 of the load lock chamber 300 or 400, for cooling.

At box 970, the first chamber volume is vented to atmosphere pressure and the cooled substrate is returned to the factory interface.

While the foregoing is directed to embodiments of the present invention, other and further embodiments of the invention may be devised without departing from the basic scope thereof, and the scope thereof is determined by the claims that follow.

What is claimed is:

1. A load lock chamber, comprising:
a chamber body assembly comprising a chamber lid, a pair of sidewalls, a bottom wall and an interior wall spanning the sidewalls and defining a first chamber volume and a second chamber volume fluidly isolated from one another by the interior wall, wherein the first chamber volume is selectively connectable to two environments through two openings configured for substrate transferring, and the second chamber volume is selectively connectable to the two environments through a second two openings configured for substrate transferring;
a cooled substrate support assembly bounding a portion of the first chamber volume, the cooling substrate support assembly comprising:
a disk shaped body having an upper portion disposed within the bottom wall, the upper portion having a substrate support surface configured to support a substrate thereon within the first chamber volume, the disk shaped body having a lower portion disposed underlying the bottom wall, and
a plurality of cooling channels disposed within the upper portion of disk shaped body, and
a lift pin assembly comprising a plurality of lift pins located within a housing below the first chamber volume and extending between the cooling channels into the first chamber volume, the lift pins configured to lift the substrate from the substrate support surface.

2. The load lock chamber of claim 1, wherein the lift pin assembly is movable relative to the cooled substrate support assembly, wherein the lift pin assembly is further configured to transfer the substrate between the cooled substrate support assembly and an external substrate handling device.

3. The load lock chamber of claim 2, wherein the chamber body assembly further defines a third chamber volume selectively connectable to the two environments through two openings, and the second chamber volume is vertically stacked between the first and second chamber volumes.

4. The load lock chamber of claim 3, further comprising a substrate support assembly disposed in the third chamber volume.

5. The load lock chamber of claim 4, wherein the second chamber volume only has one opening configured to selectively connect the second chamber volume to one of the two environments.

6. The load lock chamber of claim 2, further comprising a substrate supporting shelf movably disposed above the cooled substrate support assembly in the first chamber volume.

7. The load lock chamber of claim 6, further comprising a lift assembly configured to the lift pin assembly and the substrate supporting shelf simultaneously.

8. The load lock chamber of claim 7, wherein the lift assembly comprises:
a shaft adapted to be rotated by a motor;
a first threaded member coupled between the shaft and the lift pin assembly; and
a second threaded member coupled between the shaft and the substrate supporting shelf, wherein rotation of the shaft moves the first and second threaded members vertically.

9. The load lock chamber of claim 8, wherein the lift assembly moves the substrate supporting shelf and the lift pin assembly at different speeds.

10. The load lock chamber of claim 8, wherein the substrate supporting shelf comprises:
a ring; and
a post attached to the ring, wherein the post is coupled to the second threaded member.

11. The load lock chamber of claim 1, further comprising:
a first vacuum pump connected to the first chamber volume; and
a second vacuum pump connected to the second chamber volume, wherein the first and second vacuum pump control pressures in the first and second chamber volumes independently.

12. The load lock chamber of claim 3, further comprising:
a first vacuum pump selectively connected to the first chamber volume and the third chamber volume; and
a second vacuum pump connected to the second chamber volume.

13. The load lock chamber of claim 4, wherein the substrate support assembly comprises three or more substrate support pins.

14. The load lock chamber of claim 1, further comprising a thermal insulator disposed within the second chamber volume between the heated substrate support and the chamber body, wherein the heated substrate support assembly does not directly contact the chamber body.

15. A dual load lock chamber, comprising:
a remote plasma source;
a first load lock chamber and a second load lock chamber disposed side by side in a unitary chamber body assembly, wherein each of the first load lock chamber and second load lock chamber comprises:
a lid, an outer sidewall, a bottom wall, an inner sidewall shared between the first load lock chamber and the second load lock chamber, and an interior wall spanning the inner sidewall and the shared sidewall and defining a first chamber volume and a second chamber volume fluidly isolated from one another by the interior wall, wherein the second chamber volume overlays the first chamber volume, wherein the first chamber volume is selectively connectable to two environments through two openings configured for substrate transferring, and the second chamber volume is selectively connectable to the two environments through a second two openings configured for substrate;
a cooled substrate support assembly bounding a portion of the first chamber volume, the cooling substrate support assembly comprising:
a disk shaped body having an upper portion disposed within the bottom wall, the upper portion having a substrate support surface a configured to support a substrate thereon within the first chamber volume, the disk shaped body having a lower portion disposed underlying the bottom wall, and
a plurality of cooling channels disposed within the upper portion of disk shaped body; and
a lift pin assembly comprising a plurality of lift pins located within the housing below the first chamber volume and extending between the cooling channels into the first chamber volume, the lift pins configured to lift the substrate from the substrate support surface.

16. The dual load lock chamber of claim 15, wherein each of the first and second load lock chambers has a third chamber volume selectively connectable to the two environments through two openings, and the second chamber volume is vertically stacked between the first and second chamber volumes.

17. The dual load lock chamber of claim 15, wherein each of the first and second load lock chambers further comprises a substrate supporting shelf movably disposed above the cooled substrate support in the first chamber volume.

18. The dual load lock chamber of claim 16, further comprising a vacuum pump coupled to the second chamber volumes and the third chamber volumes of the first and second load lock chambers.

19. The load lock chamber of claim 1, wherein the lift pin assembly further comprises a lift pin actuator coupled to the lift pins and the disk shaped body attached to the lift pin actuator that includes the cooling channels and is inserted into an opening at a bottom of the housing, wherein the lift pin actuator is configured to lift the lift pins to lift the substrate from the substrate support surface.

20. The dual load lock chamber of claim 15, wherein the lift pin assembly further comprises a lift pin actuator coupled to the lift pins and the disk shaped body attached to the lift pin actuator that includes the cooling channels and is inserted into an opening at a bottom of the housing, wherein the lift pin actuator is configured to lift the lift pins to lift the substrate from the substrate support surface.

* * * * *